United States Patent [19]
Chapman

[11] Patent Number: 5,357,459
[45] Date of Patent: Oct. 18, 1994

[54] NONVOLATILE CAPACITOR RANDOM ACCESS MEMORY

[75] Inventor: Richard A. Chapman, Dallas, Tex.

[73] Assignee: Texas Instruments Incorporated, Dallas, Tex.

[21] Appl. No.: 748,483

[22] Filed: Aug. 22, 1991

Related U.S. Application Data

[60] Continuation of Ser. No. 547,545, Aug. 6, 1990, abandoned, which is a division of Ser. No. 426,520, Oct. 25, 1989, which is a continuation of Ser. No. 283,039, Dec. 5, 1988, which is a continuation of Ser. No. 755,232, Jul. 15, 1985, Pat. No. 5,281,825.

[51] Int. Cl.[5] .................... G11C 11/24; G11C 11/40
[52] U.S. Cl. .................. 365/149; 365/189.01; 365/230.01

[58] Field of Search ............. 365/149, 189.01, 230.01, 365/189.03, 189.09, 226, 222; 357/23.6

[56] References Cited

U.S. PATENT DOCUMENTS

| | | | |
|---|---|---|---|
| 3,118,133 | 1/1964 | Meeker | 365/149 |
| 4,300,212 | 11/1981 | Simko | 365/185 |

*Primary Examiner*—Terrell W. Fears
*Attorney, Agent, or Firm*—Richard A. Stoltz; Richard L. Donaldson; Rene' E. Grossman

[57] ABSTRACT

The disclosure relates to a MOSFET-protected nonvolatile capacitor cell which has a storage gate and a nonvolatile stack thereunder, the cell having a heavily doped n+ ring surrounding the storage gate and an n-type tank disposed beneath the stack and electrically connected to the n+ type ring.

7 Claims, 12 Drawing Sheets

NONVOLATILE CAPACITOR RANDOM ACCESS MEMORY

This is a continuation of Ser. No. 7/547,545, filed Aug. 6, 1990, now abandoned, which is a division of Ser. No. 7/426,520, filed Oct. 25, 1989, (now allowed), which was a continuation of Ser. No. 7/283,039, filed Dec. 5, 1988, which was a continuation of Ser. No. 06/755,232, filed Jul. 15, 1985 U.S. Pat. No. 5,281,825.

BACKGROUND OF THE INVENTION

1. FIELD OF THE INVENTION

This invention relates to semiconductor memories and, more specifically, to nonvolatile capacitor random access memories (NVCRAM).

2. BRIEF DESCRIPTION OF THE PRIOR ART

Most of the nonvolatile memory arrays which are presently available have serious limitations which have limited the market for devices of this type. In general, the nonvolatile RAMs are based upon the six transistor static RAM cell of the type disclosed by S. Saito et. al. in "N-channel High Speed Nonvolatile Static RAM Utilizing MNOS Capacitors", Japanese Journal of Applied Physics, Vol. 19, pages 225-229 (1979) and other publications. Such devices are also based upon a four transistor CMOS NVRAM cell as described in Serial No. 344,339, filed Feb. 1, 1982. Because of the large number of transistors used in these cells, such memory cells are large in size thereby limiting the number of cells that can be formed onto a silicon chip of predetermined area. The many transistors used in the above described prior art nonvolatile static RAM cells are necessary to fully isolate the nonvolatile memory element from various crosstalk mechanisms which are particularly large when the memory element can be programmed and erased at relatively low voltages.

Another approach to nonvolatile memories has been the use of two transistor cells with one memory transistor and one isolation or select transistor as demonstrated by T. Hagiwara et. al., "A 16 kb Electrically Erasable Programmable ROM", Proceedings 1979 ISSCC, pages 51-52 and 227 (1979) and other references. For best operation, these types of cells require four control lines to operate each cell. Since cells of this type are not as well isolated from the programming crosstalk and read disturb mechanisms such cells typically use nonvolitale media which require extremely high voltage, such as 20 to 25 volts and long programming times such-as about 10 milliseconds.

There has been one attempt to use a dynamic RAM-like cell in a nonvolatile memory, but in this attempt, the cells have to be block erased and could not be programmed and erased bit by bit or byte by byte without changing the programming state of unaddressed cells. This dynamic RAN is disclosed by R. Kondo et. al., "Dynamic Injection MNOS Memory Device", Japanese Journal of Applied Physics, Vol. 19, pages 231-237 (1979).

There has also been an attempt to construct non-volitale RAM cells using two control lines, a nonvolatile insulator and a vertically oriented JFET in a cross-point capacitor arrangement where the JFET gives additional isolation against crosstalk. This memory has been termed a NVJRAM and is set forth in U.S. Pat. Nos. 4,459 684 and 4,435,785. These cells are small in area, however the protection against crosstalk therein is insufficient for fast programming of nonvolitale media and the capacitance of the bit line used For signal output is slightly sensitive to the state of the programmed cells along the bit line.

The isolation against crosstalk in the NVJRAM has been improved by adding one or two MOSFETs to separate the nonvolatile element From the control lines as demonstrated in Ser. No. 311,101, filed Oct. 13, 1981 of R. Chapman, now abandoned. This memory has improved performance over the NVJRAM, however, unfortunately, it is still large in size with respect to a dynamic RAM cell and uses fabrication procedures which are not compatible with the fabrication of MOSFET peripheral circuits. The vertical JFET in the MOSFET protected NVJRAM is difficult to fabricate and the width of the JFET channel is difficult to reproduce. The efficiency of the program operation to produce the negative threshold state is lowered because of loss of current through the JFET channel by means of a short channel leakage.

In addition to the usual nonvolatile modes of operation, the nonvolatile RAMs based on the six transistors static RAM cell have the attribute of having both volatile and nonvolatile data stored on the chip with the ability to shift data from one form back to the other. This is an advantageous mode of operation but the cell is too large for use in arrays with many elements because the cell contains too many transistors. It is therefore readily apparent that what is needed is a small cell with only a few transistors which can contain both volatile and nonvolatile data. To simplify the operation of this compact cell, the volatile and nonvolatile data should be readable using the same read mechanism.

SUMMARY OF THE INVENTION

In accordance with the present invention, the above noted problems of the prior art are minimized and there is provided a minimum sized nonvolatile memory cell which is well protected against the various crosstalk mechanisms and has a memory organization which operates the memory cells using three control lines and has a memory cell design whose fabrication is compatible with the fabrication of peripheral MOSFETs as well as providing cells which-can be programmed into either nonvolatile state (programmed and erased) by bit rather than by block and cells which have larger signal output and a better isolated cell than the prior art NVJRAM. The memory cell in accordance with the present invention can be operated as a true nonvolatile RAM with the data always programmed into nonvolatile storage, the memory also being capable of operation in other useful modes, such as a virtually nonvolatile mode in which the data is normally in a volatile status and Is placed in nonvolatile status only on power down or power loss. The invention further provides a high density RAM cell in which the volatile and nonvolatile data can be sensed with one type of read cycle, this type of memory being useful because it can be divided electrically into a standard RAM and a nonvolatile RAM.

Briefly, in accordance with the present invention, the RAM cell and array organization is provided using a memory cell similar to a dynamic RAM cell with the addition of a nonvolatile stack between the storage gate and the silicon substrate with an n+ region adjoining and slightly overlapping and underneath the nonvolatile stack. The nonvolatile stack is a region capable of storing charge For extended lengths of time. In accordance with one embodiment of the invention, an n-type tank is added underneath the nonvolatile stack. The storage gate, nonvolatile stack the n+ region and, in one embodiment, the n-tank constitute a nonvolatile capacitor which may be programmed into a state of high capacitance or into a state of low capacitance. Either low or high capacitance states can be programmed bit or byte selectively using only positive voltages. The n-tank and overlapping n+ regions are necessary to program positive charge into the nonvolatile stack in one operation. The embodiment without the n-tank must use a floating conducting layer inside the nonvolatile stack and can only be programmed selectively in bytes. The memory array of the NVCRAM cells can be operated as a high capacity DRAM cell, a nonvolatile memory, a virtually nonvolatile memory or an assigned-Function array constituting part DRAM array and part nonvolatile memory array.

DESCRIPTION OF THE PREFERRED EMBODIMENT

Figure 1:
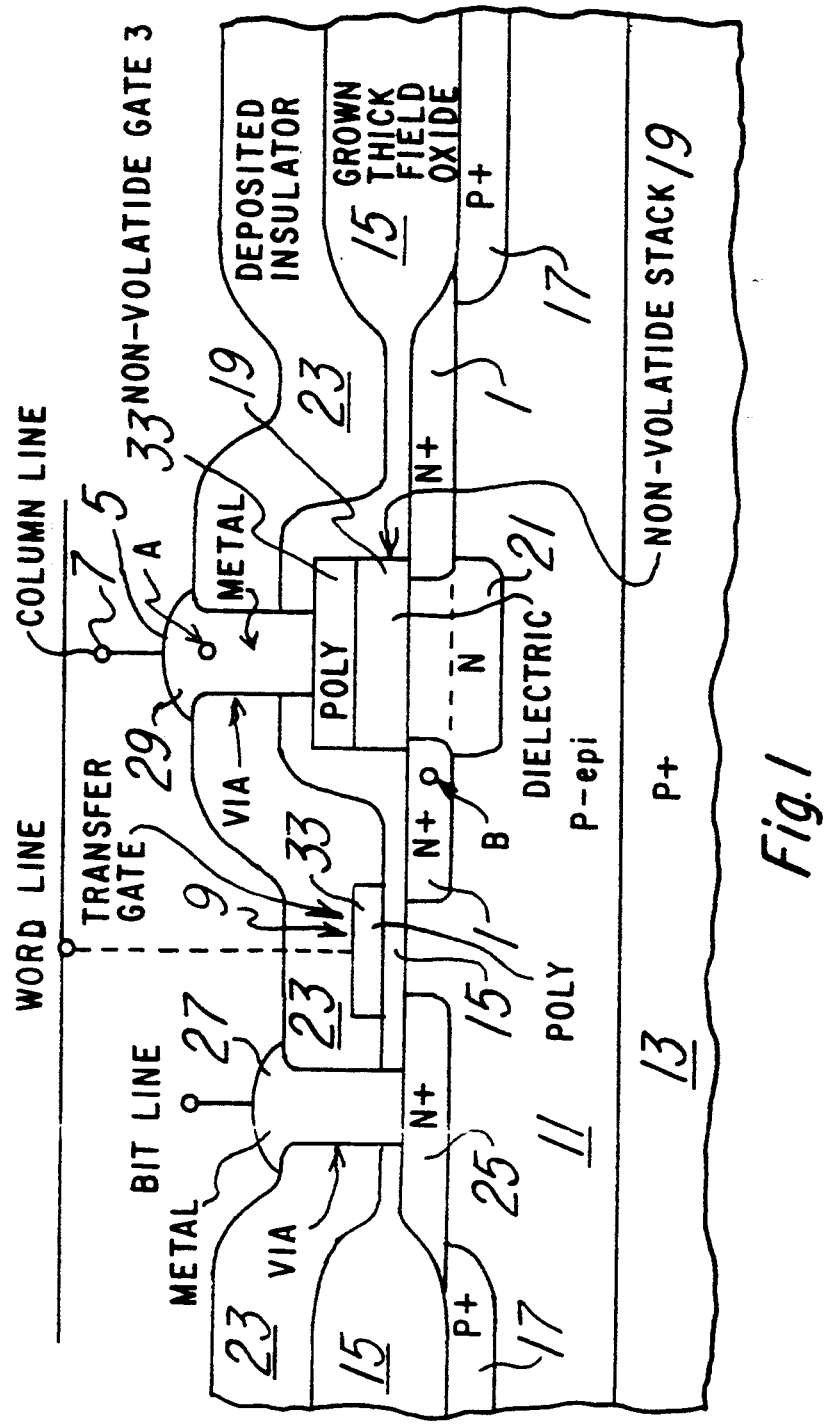
FIG. 1 is a cross-sectional view of an NVCRAM cell using an n+ ring around the nonvolatile capacitor.

Referring now to FIG. 1, there is shown a cross section of a first embodiment of the NVCRAM cell in accordance with the present invention which utilizes a ring-shaped n+ region 1 completely surrounding a nonvolatile gate 3 formed of polycrystalline silicon and being connected through a metal layer 5 of aluminum or the like to the column line of the memory array 7. In the embodiment of FIG. 1, the circles for the bit and column line indicate that these lines go into the paper. The word line is oriented parallel to the surface of the paper and the dashed line therefrom indicates that the word line connection to the polycrystalline silicon transfer gate 9 is on a plane parallel to the drawing surface. It should be understood that other orientation of the bit line, column line and word line can be utilized and the orientation shown herein is merely by ways of example. The semiconductor device can be fabricated as n-channel or p-channel, the preferred embodiment being shown as an n-channel device fabricated on a p-type epitaxial layer 11 which is disposed on a p+ type silicon substrate 13. The p-type doping of the epitaxial layer 11 is preferrably in the range of about $5 \times 10^{14}$/cc to $5 \times 10^{16}$/cc concentration.

Figure 4:
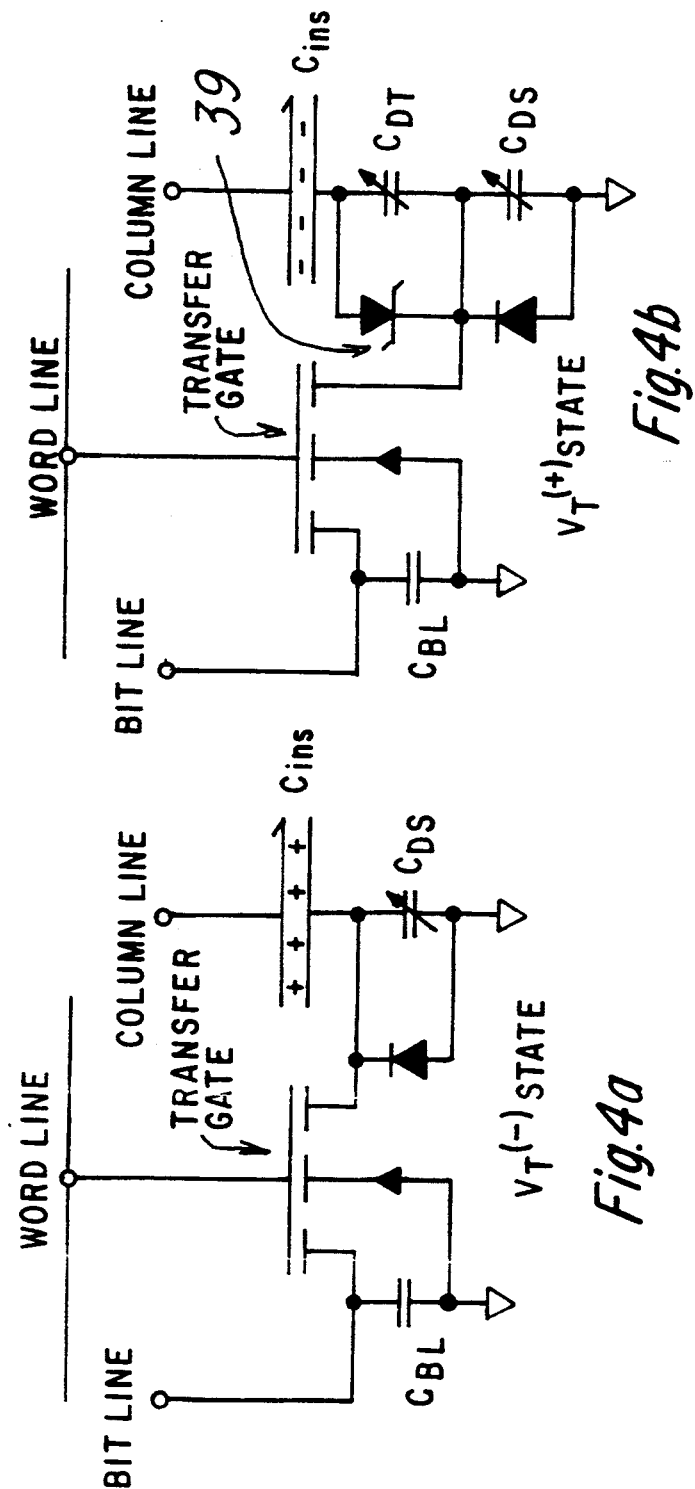
FIG. 4A and 4B are equivilant circuits for the nonvolatile capacitor in (A) the positive threshold program state and (B) the negative-threshold RAM state.

The structure is fabricated using any one of the well known silicon Fabrication procedures with several different possibilities as to the order of the steps as is well known to those skilled in the art. This structure shows a thick field oxide 15 and a p+ channel stop 17 to define and isolate the working parts of the array. The nonvolatile capacitor itself is comprised of the polycrystalline silicon nonvolatile gate 3, a nonvolatile dielectric stack 19, and n-type tank 21 beneath the nonvolatile stack and the ring of n-type material 1 surrounding the tank and the nonvolatile gate 3. The nonvolatile stack 19 may be of a single composition or of multiple composition layers which are capable of charge storage. A nonvolatile stack of this type is set forth in FIG. 4 of U.S. Pat. No. 4,435,785. The stack 19 can be, for example, a multiple layer composed of tunnel oxide having a thickness 10 to 40 angstroms, a silicon nitride layer having a thickness of 50 to 500 angstroms and blocking oxide layer having a thickness of 20 to 80 angstroms. The stack could also be comprised of conducting floating layer such as a metal layer, a polycrystalline silicon layer or a dopant sandwiched between two insulator layers such as silicon dioxide, each 100 to 700 angstroms thick. The doping level in the n-type tank must not be extremely high and is optimately in the low end of the $10^{15}$/cc to mid $10^{16}$/cc range, determined by a need for the surface depletion layer capacitance in this material being considerably smaller than the capacitance of the nonvolatile gate/nonvolatile stack capacitor. The n+ concentration of the n+ ring 1 must be high and in the range of about $10^{18}$/cc to $10^{21}$/cc such that the resistance per unit square area is negligible and that low voltage breakdown be obtained beneath the nonvolatile insulator stack. The junction depth of the n+ region 1 must be large enough to overlap the nonvolatile gate for optimum performance. This n+ layer may be used For source/drains in transistors in other parts of the circuit. The thicker insulators beneath the standard transistors prevents gate-induced diode breakdown for these devices. Typical junction depths are 0.2 to 0.6 microns for the n+ layer 1 and 0.5 to 4.0 microns for the n-type tank 21.

The polycrystalline silicon transfer gate 9 is disposed over a grown silicon dioxide insulator 15 having a thickness of about 200 to about 1,000 angstroms. An enhancement implant, such as a light implant of boron, may be used in the channel region of the transfer gate. Finally, vias are cut through the thermal oxide 15 and the deposited oxide 23 for the making of contact to the nonvolatile gate 3 and the n+ type region 25 adjacent gate 9 with metal being deposited into the vias, a first metal region 27 contacting the n+ region 25 and a second metal region 29 contacting the nonvolatile gate 3. The metal layers 27 and 29 can be the same metal layers because the two links are parallel. A preferred metal for use in the vias Is aluminum. It can be seen that the contact 27 is connected to the bit line whereas the contact 29 is connected to the column line. It should be understood that other types of control lines and control line connections to the NVCRAM cell may be used. For example, the bit control line could be n-type without metal so that the via and metal line would not be required. In another embodiment, the column line could be polycrystalline silicon and the contacting between the column line and the polycrystalline silicon nonvolatile gate 3 could be a polycrystalline silicon to polycrystalline con contact. In yet another embodiment, the word line could be formed of metal and contact to the transfer gates using vias.

Figure 2:
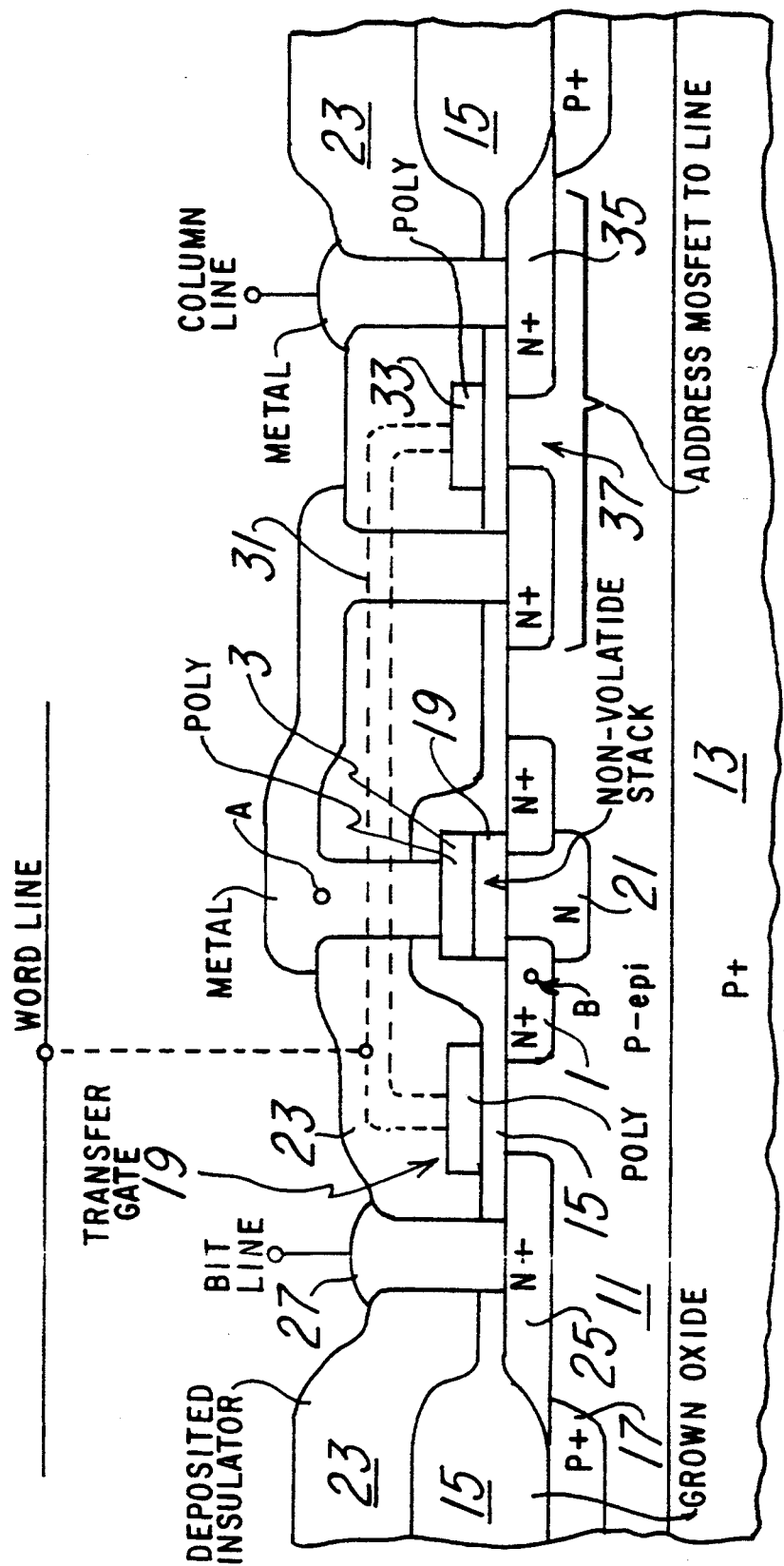
FIG. 2 is a cross-section of an NVCRAM cell with a protection MOSFET on the column gate address line.

Referring now to FIG. 2, there is shown a second version of the NVCRAM cell in accordance with the present invention which uses an n-channel address MOSFET in the column control line in addition to the transfer gate to the bit line. The inclusion of the additional address MOSFET improves the isolation of the cell to some extent. The dashed lines 31 indicate that the two polycrystalline silicon gates 19 and 33 are connected on a plane parallel to the plane of the cross section of the contact between the nonvolatile gate 3 and the n+ source 35 of the MOSFET 37 using metal to connect these regions through vias cut in the insulators 23 and 15. Another method of making this connection is to use polycrystalline silicon continuing over from the nonvolatile gate 3 and overlapping and contacting the n+ region 35 in any one of the several varied contact techniques which are well known in the art. These versions of the NVCRAM cell with an added MOSFET 37 will have improved isolation from voltage pulses on the column control line.

Figure 3:
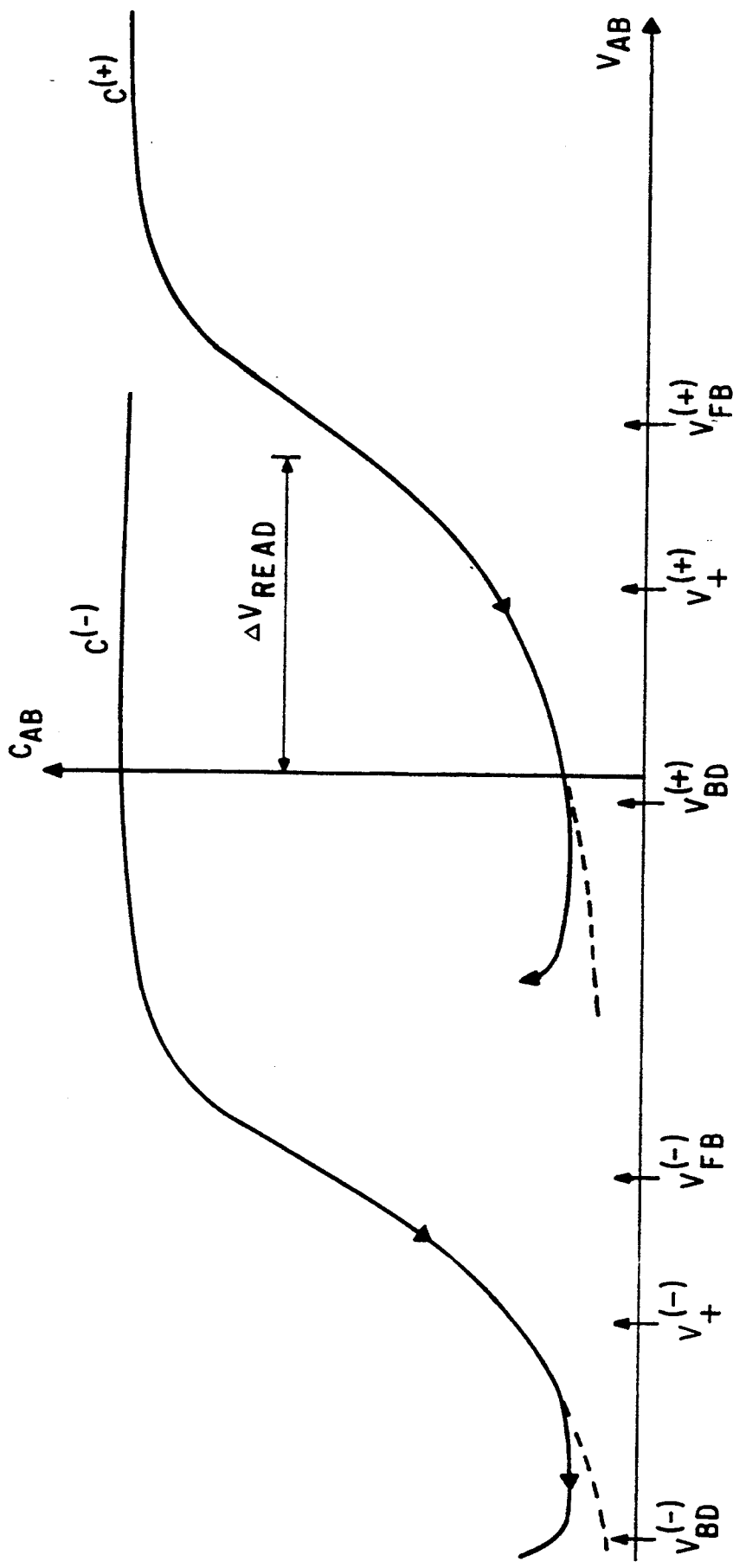
FIG. 3 is a graph of capacitance versus voltage for the two RAM states of the nonvolatile capacitor.

Referring now to FIG. 3, there is shown a graph or the capacitance $C_{AB}$ between the nonvolatile gate 3 and the n+ region 1 or the addressed nonvolatile capacitor formed with the regions 1, 3 and 19 of FIGS. 1 and 2. The capacitance versus voltage between the gate 3 and the metal contact 5 thereon and the n+ region 1 is shown for (1) the case of a positive threshold $V_t$ programmed by means of negative charge stored in the nonvolatile stack 19 and (2) a case of a negative threshold $V_t$ caused by the positive charge stored in the nonvolatile stack 19. The parameters shown on the horizontal scale are the flat band voltage $V_{FB}$ and the breakdown $V_{BD}$ for the two program states. In either programmed threshold state, high capacitance is due to an accumulation layer at the surface of the tank 21 beneath the nonvolatile stack 19. The shift in threshold and flat band voltages between the two programmed states is caused by the storage of charge in a nonvolatile stack. The programmed state of the cell is sensed by one of several techniques in which the voltage is varied over the range delta $V_{READ}$ as shown in FIG. 3. The signal difference between the two states is large if delta $V_{READ}$ occurs in a region of voltage for which $C(+)$ is generally low in value and $C(-)$ is generally large. Not only must the region For reading $C(+)$ be outside the large capacitance region due to accumulation shown on the right hand side of each of the curves of FIG. 3, but the reading region also must not include the breakdown voltage $V_{BD}(+)$.

The results of FIG. 3 and the operation of NVCRAM cell can best be understood with reference to FIGS. 4A and 4B. FIGS. 4A and 4B disclose the equivalent circuits for the cell of FIG. 1 in the voltage range used for reading For the cases programmed into (A) the negative threshold state and into (B) the positive threshold state as described in FIG. 3. The capacitance $C_{BL}$ is the capacitance of the Floating bit line which is typically in the range of 500 to 1,000 femtofarads. The state of the charge in the nonvolatile stack is indicated by the "+" and "−" signs in FIGS. 4A and 4B. In the case of a negative threshold state (A), the positive charge in the nonvolatile stack 19 attracts the electrons of the tank 21 such that the silicon surface beneath the non-volatile stack is accumulated. In this case, (A), the capacitance between the nonvolatile gate 3 and the n-type ring 1 is equal to the insulator capacitance $C_{INS}$ which is designed to be very large. For instance, for a total silicon nitride thickness of 150 angstroms and a total silicon dioxide thickness of 50 angstroms, the specific capacitance of the nonvolatile stack 19 is $2.6 \times 10^{-7}$ farads per square centimeter. For a stack area of 100 micrometers square, this makes $C_{INS}$ equal to 260 femtofarads. The variable capacitance $C_{DS}$ is a depletion layer capacitance from the n-tank 21 and n+ ring 1 to the p-type epitaxial layer 11. The capacitance of $C_{DS}$ is made small in comparison to $C_{INS}$ by means of using low doping in the p-type epitaxial layer in the range of less than about 5 times $10^{15}$/cc. For instance, if the tank 21 is uniformly doped at $1 \times 10^{16}$/cc and the epitaxial layer is doped at $1 \times 10^{15}$/cc, then the depletion layer specific capacitance is $9 \times 10^{-9}$ farads per square centimeter at one volt reverse bias, making $C_{DS}$ equal 18 femtofarads per square centimeter for a 200 micrometer square tank plus n+ layer area 1.

In some applications, it may be desired to increase the total capacitance of the cell. This is accomplished by using higher p-type concentration beneath the n-tank 21 as is done in the "high-C" cell design as disclosed by Tasch at. al., "The High-C RAM Cell Concept", IEEE Transactions of Electron Devices Volume ED-25, pages 33–41, Jan. 1978. This high-C design will not increase the programmable portion of the cell capacitance.

FIG. 4A shows the negative threshold state case of high capacitance of the nonvolatile capacitor caused by the storage of positive charge in the nonvolatile stack 19. During the read operation using the delta $V_{READ}$ of FIG. 3, the surface of the n type regions 21 beneath and surrounding the nonvolatile gate 3 is accumulated for the case of FIG. 4B and there is no depletion layer at these surfaces and no large electric field in the silicon at the surfaces. Also, in case (A), the dark current created by surface states is small because of surface accumulation. This state has good volatile retention of a voltage on the n-type tank 21 when it is floating (the dark current comes from the generation current in the depletion layer between the n-type layers and the p-type epitaxial layer).

FIG. 4B shows the equivilant circuit for the NVCRAM cell programmed into a positive threshold state by means of negative charge storage in the nonvolatile stack 19. The presence of negative charge rapells the electrons in the n-type tank 21 and causes the creation of a depletion layer at the surface of the tank. The capacitance of this depletion layer, $C_{DT}$ can be adjusted to be much smaller than $C_{INS}$ by means of making the doping in the tank small. For instance, if the tank is uniformly doped to 1 times $10^{16}$/cc and the surface potential beneath it the tank is at equilibrium with the tank, then the specific capacitance of the surface inversion layer is 3.4 times $10^{-8}$ per square centimeter and $C_{DT}$ is 34 femtofarads for 100 square micrometers. IF the surface is reversed biased with respect to the tank 21, then $C_{DT}$ is even smaller. Since the capacitance between the nonvolatile gate and the neutral tank 21 or n+ regions 1 is a series sum of $C_{INS}$ and $C_{DT}$, total capacitance $C_{AB}$ will be dominated by the smaller of the two with the result that this case (B) results in low capacitance. The electric fields in the n-type regions beneath the nonvolatile capacitor can now be large, especially at the periphery of the n-tank 19 where it intersects the n+ ring 1 at the surface adjoining the nonvolaitile stack 19. This intersection region can have a leakage current which increases with increasing voltage difference between the nonvolatile gate and the n-type regions. This effect is especially important in the case with a laterally graded concentration of n-type between the n+ and n− tank beneath the nonvolatile stack. As the applied voltage difference becomes more negative, the depletion layer penetrates more deeply into the regions of higher n-type concentration, resulting in higher electric Field in a region of low electric Field breakdown. The degree of this penetration into this region of low breakdown voltage and high current depends on $C_{INS}$. A large $C_{INS}$ results in low threshold voltage or, in other words, the depletion layer penetrates into the n+ at lower voltage. This effect of voltage induced breakdown is suggested in FIG. 4B by means of the Zener diode symbol 39. For sufficient difference between the two program states over the voltage range delta $V_{READ}$ to be used for reading as shown in FIG. 3, the current due to breakdown must not be large over the voltage range delta $V_{READ}$.

Another requirement on proper design for an efficient read mechanism is that the application of a reading voltage of about 5 volts does not cause a surface depletion layer which penetrates to the n-tank/p-epitaxy junction. If the tank is doped to $1 \times 10^{16}$/cc and a 5 volt read voltage difference between the tank and the nonvolatile gate is used, the surface depletion layer will penetrate to 0.8 micrometers. Thus, a tank depth of 1 to 1½ micrometers is adequate when using a tank doped to $1 \times 10^{16}$/cc.

The memory cell is programmed by the application of a large voltage across $C_{INS}$. This large voltage causes a large electric field which, in turn, causes charge to be pulled into or pushed out of the nonvolatile stack 19. At the lower voltage corresponding to the read operation or to the quiescent storage mode, the electric fields are much lower and the charge remains in the nonvolatile stack.

To obtain the positive threshold state, a large positive voltage must be applied to the nonvolatile gate while the n-tank 21 is held at 0 volts (large and positive $V_{AB}$). This results in negative charge being pulled into the nonvolatile stack 19 from both the n+ ring 1 and n-type tank 21. This operation can be performed bit selectively in the following manner (1) for selected cells, the transfer gate of FIG. 1 is turned on and the bit line is held at 0 volts while the positive voltage is applied to the nonvolatile gate 3, (2) for nonselected cells the transfer gate of FIG. 1 is held off so that the n-tank 21 and connected n+ region 1 are floating when positive voltage is applied to the nonvolatile gate 3. In the second case, most of the voltage applied will drop across the tank-substrate junction which becomes reverse biased such that the voltage drop across the nonvolatile stack 19 is too small for programming.

One manner of programming the negative threshold state is to apply a large negative voltage to the nonvolatile gate 3 while the n-tank 21 is at 0 volts. The preferred manner of programming the negative threshold state is to apply a large positive voltage supplied From the bit line of FIG. 1 to the n-tank 21 and adjoining n+ region 1 while the nonvolatile gate 3 is held at 0 volts. In either case, $V_{AB}$ is negative. The use of only positive voltages on the gate and the n-tank is to be preferred because it is easier to design peripheral circuits to direct voltages of one polarity to the memory cells. Using positive programming voltage on the tank, the isolation of cells not selected for programming the negative threshold can be accomplished by turning off the transfer gate. During programming the negative threshold state by applying a large positive voltage to the tank, it is necessary that this voltage not result in the penetration (to the tank tops surface) of the depletion layer of the n-tanks/p-epitaxy junction. This goal is accomplished by proper selection of the tank doping and thickness and p-epitaxy doping. For example, if the tank 21 is doped uniformily to $1 \times 10^{16}$/cc and the epitaxy is doped to $1 \times 10^{15}$/cc and the tank is 12 volts reverse biased, then the depletion layer penetrates 3.75 micrometers into the epitaxy and 0.37 micrometers into the tank. A tank depth of 1 micrometer is adequate to keep the junction depletion layer From the top surface.

It is important to understand the relationship between the read operation and the program negative threshold operation which may both use positive voltages on the tank. The read operation requires that a low voltage of about 5 volts not cause breakdown whereas the program negative threshold operation requires that a larger positive voltage of about 12 volts not cause breakdown between the n+ layer and/or the n-tank and the surface depletion layer. The n+ layer 1 permits this operation, at the read voltages the n+ layer not being depleted and having low electrical field but at high voltages the n+ layer being inverted with the result that the electric field penetrates to a region of low breakdown voltage. Thus, during the read operation, a 5 volt depletion layer can be sustained with a 0.8 micrometer depletion depth, but at high voltages, only a 1 to 2 volt difference can be maintained between the tank and the top surface of the tank. Thus, during programming of the negative threshold state using a large positive voltage on the tank, a surface depletion layer does not penetrate toward the tank junction as much as it does during the read operation.

Figure 5:
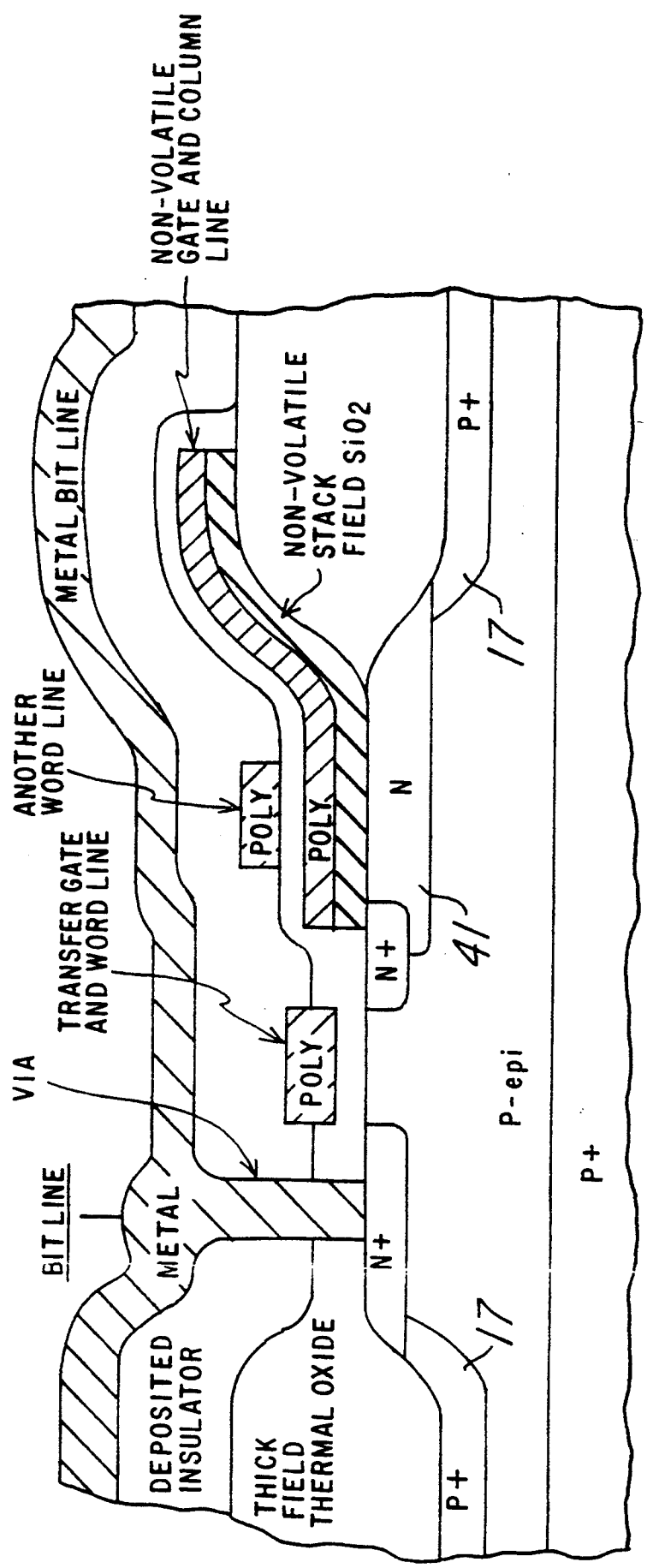
FIG. 5 is cross-section of the NVCRAM cell using an n-type tank to provide an n-type region surrounding the nonvolatile capacitor.

The compactness of the NVCRAM cell shown In FIG. 1 can be improved and the Fraction of cell area appearing as nonvolatile gate can be improved if the n-type region 1 surrounding the nonvolatile gate 3 and adjoining the thick field insulator 19 can be moved beneath the thick Field oxide 15. FIG. 5 shows a preferred embodiment of the NVCRAM cell using an n-type tank 41 intersecting and overriding the p-channel stop 17. This structure can be built using a tank implant and impurity drive in before the growth of the thick field oxide using a phosphorous doped n-tank. This means of fabrication has the advantage of increased phosphorous concentration immediately beneath the Field oxide due to the well-known "snowplow" effect in which phosphorous is rejected by the growing thermal oxides. The tank can also be implanted using high energy phosphorous after the thick field oxide has been grown. Forming the n-tank by high energy phosphorous implantation after growth of the Field oxide has the advantage that the maximum phosphorous concentration is (1) deep beneath the non-volatile gate and (2) immediately beneath the field oxide because of energy loss by the phosphorous ions as they pass through the field oxide. The insulator thicknesses and doping concentration used in the embodiment of FIG. 5 are similar to those already discussed For FIGS. 1 and 2.

The cell cross section of FIG. 5 is similar to the cross section of DRAM cells of the type disclosed by V. L.

Rideout, "One-Device Cells For Dynamic Random Access Memories: A Tutorial", IEEE Transactions on Electron Devices, ED-26, Pages 839–852 (1979) constructed by one of the Following means: (1) a single polycrystalline silicon level For the gates, (2) metal gates and (3) several versions of a Folded bit line cell using two polycrystalline silicon levels For gates. The three major structural differences between the NVCRAM cell and the various versions of the DRAM cell are (1) the introduction of the nonvolatile stack, (2) the n-tank and its structure beneath the nonvolatile stack and (3) the n+ region on at least one side of the storage gate electrode. The NVCRAM cell must be somewhat larger an area than a DRAM cell because the n-tank must have its edge in the area between the edges of the transfer gate and the nonvolatile storage gate. This is an added geometric feature. Furthermore, IF the n-tank is extremely deep, the overlap of the tank with the thick Field requires a width of the thick field region between adjoining cells. This latter problem can be alleviated by the implantation of the n-tank through the silicon nitride/silicon dioxide stack (not shown) after the thick field oxide is partially grown, thus limiting the extent of the n-tank implant to the region inside the bird's beak area adjacent to the nitride/oxide stack. After the tank diffuses in during fabrication, this process results in a tank partially self registered to the edge of the thick field oxide.

It should be apparent to those skilled in the art that the structure of the nonvolatile capacitor could also include an enhancement implant underneath the nonvolatile stack and at the top of the n-tank and overridden by the n+ implant.

The control line connections shown in FIG. 5 are a metal bit line oriented in the plane of the cross section, polycrystalline silicon word lines oriented perpendicular to the plane of the cross section and a column line/storage gate line which may run either parallel to or perpendicular to the plane of the cross section. FIG. 5 shows the cross section of one cell. In a more usual design, two cells will share one via to the metal bit line. In this version, the drawing would have to include a transfer gate, n-tank and nonvolatile gate and stack to the left of the via so that the drawing would be symmetrical about a vertical line running vertically through the via.

The nonvolatile state of the NVCRAM cell can be sensed in one of three general methods. (1) the capacitive feedthrough method (2) standard DRAM operation (3) a nonvolatile DRAM/fast-read. In the capacitive feedthrough read mode, the bit line of the cell of FIGS. 1, 2 or 3 is preset to a predetermined value and the voltage on the column line is changed by a voltage step. The voltage on the floating bit line changes by an amount proportional to the voltage step on the column line and related to the capacitance of the nonvolatile capacitor. The voltage change on the floating bit line is larger for the case of larger programmed capacitance (i.e. the negative threshold state). The voltage change on the floating bit line can be sensed in any one of several well known techniques including the setting of a sense latch (sense-refresh amplifier) using a dummy cell or reference voltage. Positive or negative going voltage steps may be used on the column line. It is also possible to read the cell by a capacitive feedthrough technique in which the column line is preset and floated and the voltage input step is applied to the line labeled "bit line" in FIGS. 1, 2 and 5. This latter method results in larger capacitance and lower output signal on the floating line and in some sensitivity of signal output to the nonvolatile state of unaddressed cells.

The cell can also be read as a DRAM cell. The read technique is well known and involves setting the capacitor to a given voltage for a "1" state and a different voltage for a "0" state and then floating the cell. At a later time set by the maximum storage time (for instance no longer than four milliseconds), the bit line can be preset to a given voltage, floated, and then connected to the capacitor cell by turning on the selected word line. The "1" and "0" states can be distinguished from each other by whether the preset bit line voltage changes in order to charge up the capacitor cell. In the case of the nonvolatile capacitor cell, there are three significantly different signal states: (1) the high capacitance state charge to the higher of two read voltages, (2) the high capacitance state charge to the lower of two read voltages, and (3) the low capacitance state with a small difference between the two charged states. Since only two states are needed for the operation of a memory, the states (1) and (3) above should be selected for the operation of a nonvolatile memory because of the larger signal differences between the two states. If only volatile information is to be stored and read, the states (1) an (2) above would be used.

The nonvolatile DRAM sense mode is similar to the DRAM read mode with the exception that the state of the cell is interegated as soon as possible after precharging the cell capacitor. This total read operation is completed in less than a microsecond, making this read operation much less sensitive to the dark current in imperfect cells which would normally be defective cells in the true DRAM read mode. More specifically, in the nonvolatile DRAM read mode, the bit line voltage is preset to a predetermined value and the selected word line is turned on to set the n-tank to a predetermined voltage. The next step is to turn off the selected word line. Then, with a minimum delay, the voltage on the bit line is changed and the bit line is floated after another minimum delay. The selected word line is turned on a second time so that the bit line either charges up or discharges from the nonvolatile capacitor to a value depending upon the nonvolatile capacitance and the previous charged state of the nonvolatile capacitor as is the case in the DRAM read mode.

As described hereinabove, the NVCRAM cell shares certain structural similarities with a DRAM cell and can be operated as a DRAM cell. Thus, the NVCRAM cells can be arrayed as DRAM cells and combined with the standard peripheral circuits to construct a working memory integrated circuit in the usual arrangement. The memory array is divided into subarrays which are separated by peripheral circuits which are shared by the subarrays. For example, the sense-latches (e.g., sense-refresh amplifiers) are placed between two subarrays which share the use of these sense latches. This is one possible arrangement for the NVCRAM integrated circuit in any one of the three read modes. One limitation of the shared sense latch configuration is that it is difficult to address (For sensing the condition of the sense latches) simultaneously more than several sense latches. In the usual arrangement, only one sense-latch condition is sensed at one time. One of the major applications for nonvolatile memories is for use on microprocessor chips. For this reason, the nonvolatile memory is designed to be read in bytes, words, or rows of data. A one-sided layout of the nonvolatile memory array is best suited for byte or row data input/output so that the sense-refresh amplifiers can be read or written in groups.

Figure 6:
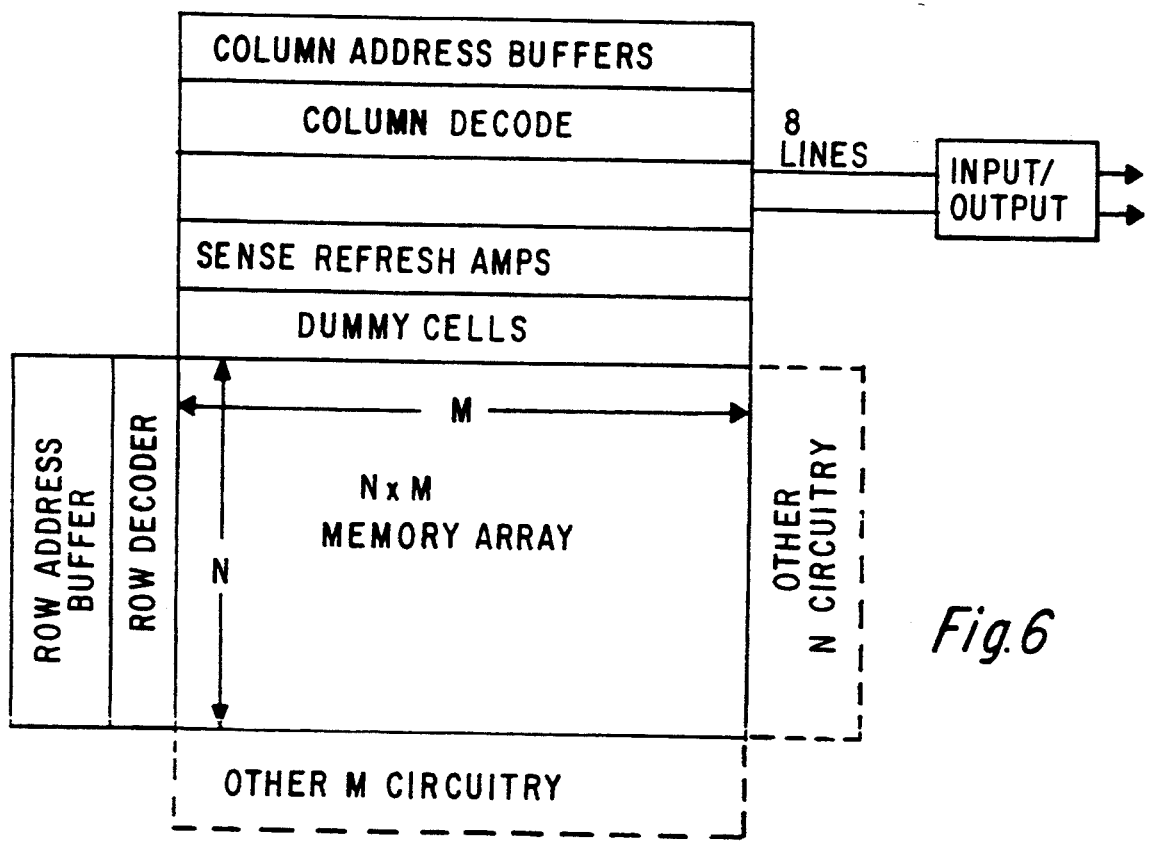
FIG. 6 is a diagram of a memory organization for the NVCRAM with open access to the sense-refresh amplifiers for efficient input/output addressing by word rather than by bits.

FIG. 6 shows a memory array organization well adapted to input/output operation in bytes, words, or rows. The n×m NVCRAM array must be layed out using folded bit lines so that the sense-refresh amplifiers operate and compare two bit lines on the same side of the sense-refresh amplifiers, The construction and operation of folded bit line DRAM memories is well known. FIG. 6 shows the n×m memory array, a row address buffer to receive and hold the row address, a row decoder to properly apply voltages to the row word lines, dummy cell word lines for proper operation of the sense-refresh amplifiers, a row of sense-refresh amplifiers which compare the signal voltages on the bit lines with NVC-cells to voltages on the bit lines with dummy cells, a column decode circuit for properly addressing the sense-refresh amplifiers, column address buffers for holding the column addresses, and input output circuits (shown with By-8 input/output in FIG. 6). In addition to those peripheral circuits shown in the figure, there are also the usual DRAM circuits and, in addition, additional circuits for the nonvolatile operation of the array (shown by dashed lines for some cases in FIG. 6). The arrangement shown in FIG. 6 is well adapted by byte, word, or row input/output because the input/output lines do not have to pass over the bit lines in this one-sided array layout.

Figure 7:
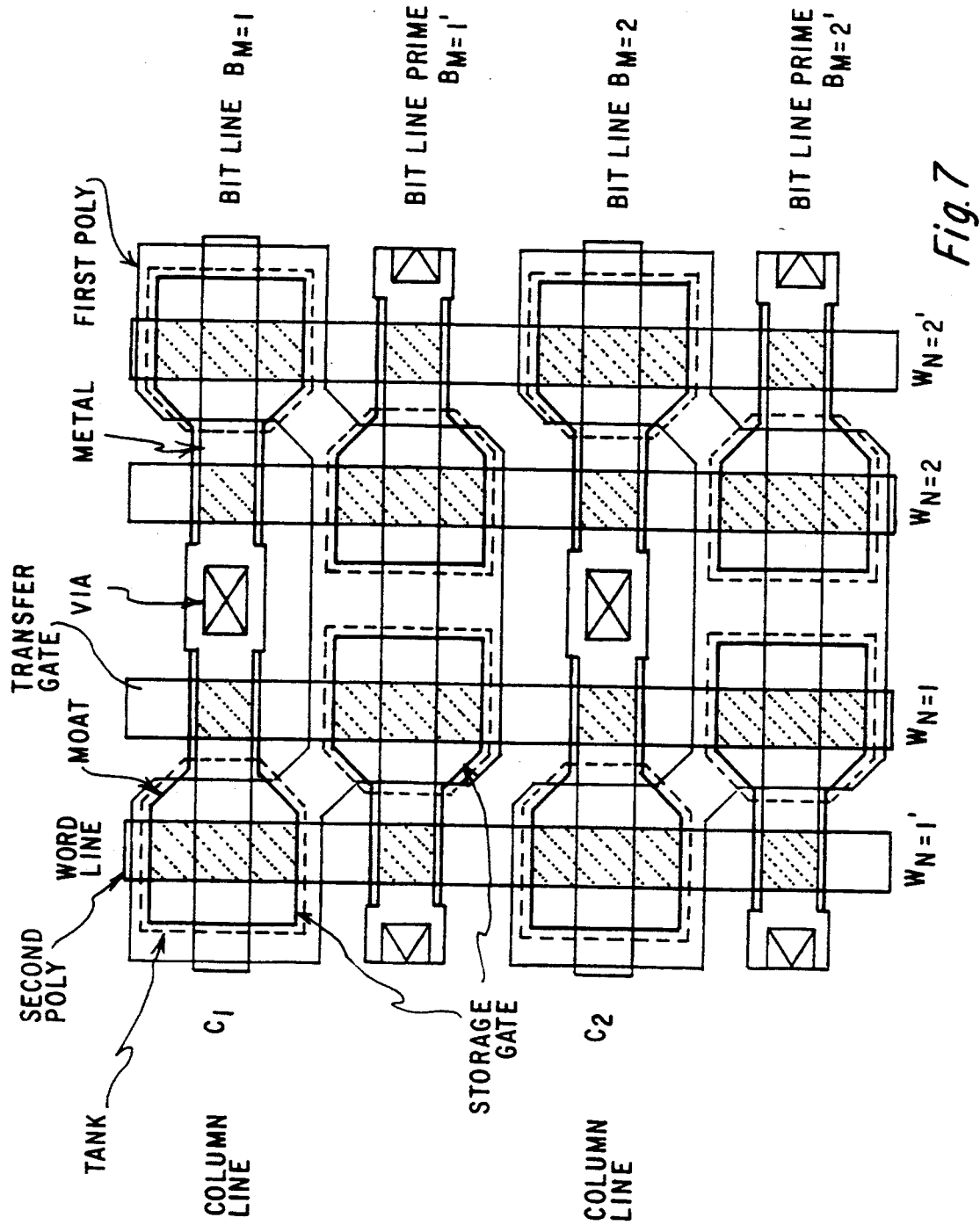
FIG. 7 is a top view of a cell in accordance with the present invention showing the folded bit line architecture with storage gate lines parallel to the bit lines and using an n-type tank.
Figure 8:
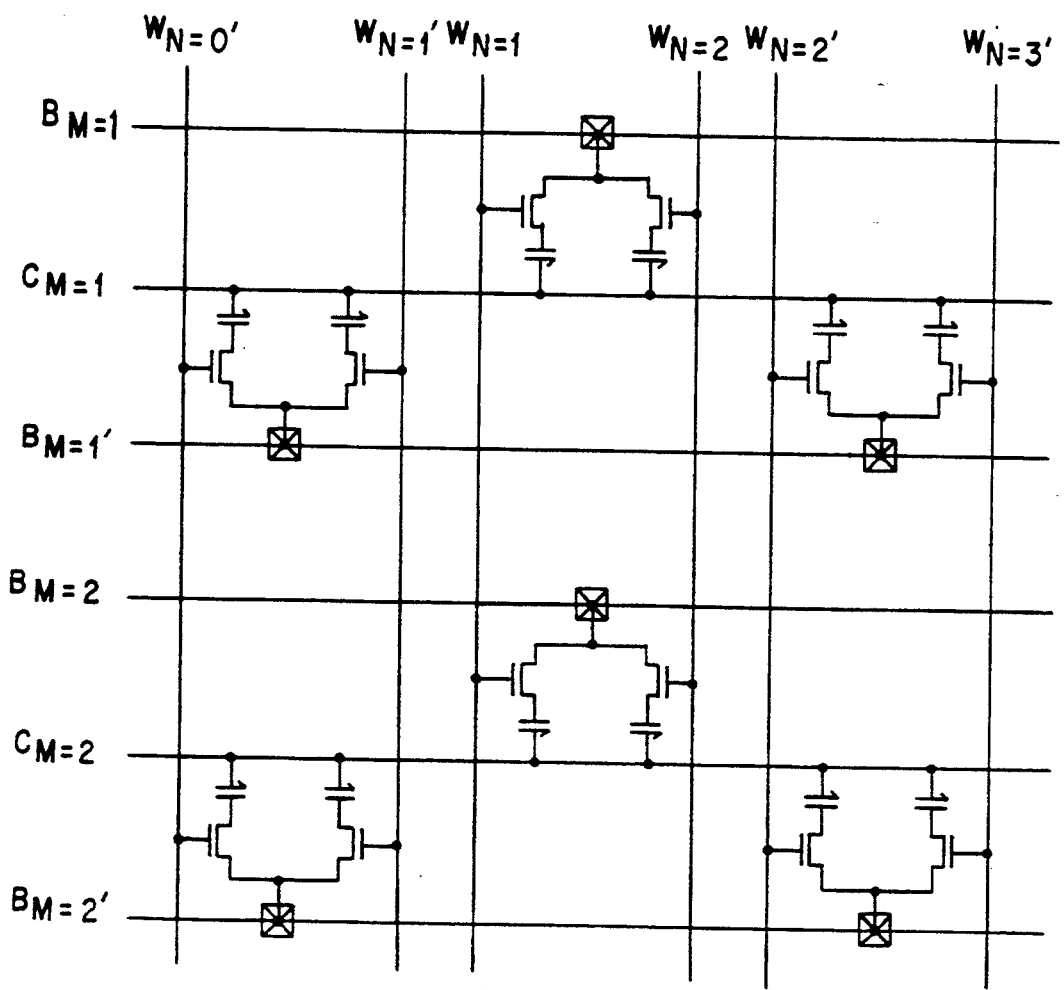
FIG. 8 is a circuit diagram of NVCRAM cell connections for the architecture of FIG. 7.

Although the NVC-ram array can be layed out in open-bit-line or folded-bit-line configuration, the preferred embodiment is a folded-bit-line configuration. FIG. 7 shows a top view of the preferred embodiment with the storage gate lines (column lines) parallel to the bit lines. FIG. 8 shows the electrical connection corresponding to the array of FIG. 7. The array in FIG. 7 shows a portion of a large array. Shown in FIG. 7 is a portion which has four word lines W(N=1'), W(N=1), W(N=2'), and W(N=2) shown as vertical second level polysilicon strips and four bit lines B(M=1) B(M=1') B(M=2) B(M=2') shown as horizontal metal strips which constitute two folded bit line pairs. Two column lines C1 and C2 are shown as first level polysilicon. The moat regions are separated from each other by thick field oxide regions, the N-type tanks shown as dashed lines and the vias which connect N-type moats to the horizontal metal bit lines. In the arrangement shown, one via shares two cells but otherwise the cross section of FIG. 5 is an accurate description of a horizontal cross section along one bit line in FIG. 7.

Figure 9:
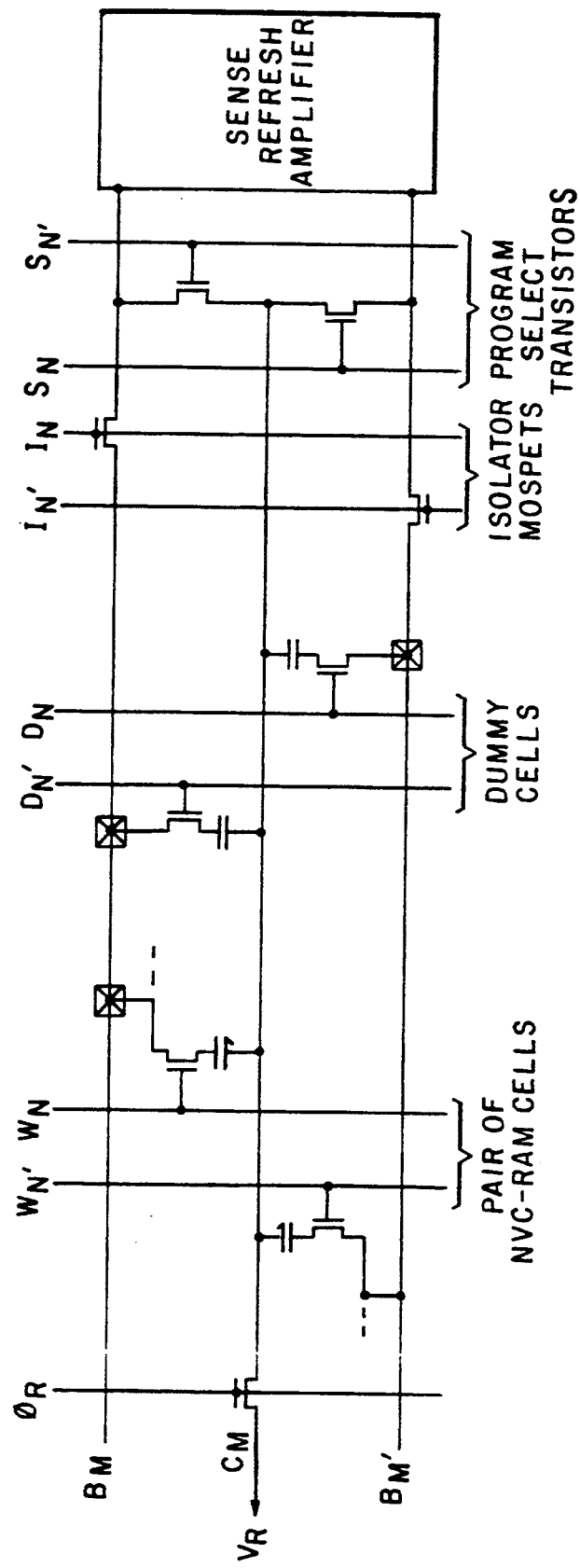
FIG. 9 is a circuit diagram of a folded-bit-line pair connected to a sense refresh amplifier.

The operation of the array of FIG. 7 can be understood using FIGS. 8 and 9. FIG. 8 shows the connections for a portion of the array; FIG. 9 shows the dummy cells and the dummy word lines D(N) and D(N') which must be added for proper operation. The DRAM read and volatile write operations would be carried out in the usual manner with all column lines dc at a high or low voltage V(R) shown in FIG. 9 depending on the mode of DRAM operation selected. In the read and volatile write modes, the program select MOSFETs operated by S(N) and S(N') in FIG. 9 are turned off. The capacitive feedthrough read mode would be carried out after the bit lines have been preset and floated by the action of pulsing V(R) through the MOSFETs activated by $\phi_R$. The dummy cell capacitor gates are also connected to the column lines as shown In FIG. 9. Thus, in the feedthrough mode, the sense-refresh amplifiers will compare the capacitive feedthrough of the nonvolatile cells and of the dummy cells. The array may be operated In the one sided fashion associated with FIG. 6 or an identical array can be placed on the other side of the sense-refresh amplifiers and any one of several folded bit line sense-refresh operations can be used.

Programming and refreshing the nonvolatile state of the cells in the one step bit selective fashion Is facilitated by the arrangement of FIGS. 7, 8, & 9 with the parallel bit lines and column lines. For proper programming operation, it is necessary to add the isolation MOSFETs operated by I(N) and I(N') in FIG. 9 and to add selection MOSFETs operated by S(N) and S(N') in FIG. 9 to direct the voltage of one bit line onto a column line for programming. If the sense-refresh amplifiers, which normally operate at the read and volatile write voltage (about 5 volts) can also operate at the programming voltage (about 12 volts), then the initial programming of the cells can be carried out in a straightforward manner, first writing the "M" bit line cells and then the "M'" bit line cells. The data to be programmed onto the M cells is used to set the state of the sense-refresh amplifiers to a 0 V or 5 V state and then the isolation and select MOSFETs are activated to place the desired voltage on the M bit lines and the corresponding column line with the M' bit lines isolated. The selected word line is addressed and the transfer gates on one line are turned on. Now the voltage state of the sense-refresh amplifiers can be pulled up to 12 V, thus programming the state of the M cells on one row. In a later step, the data for the M' cells on the same row can be set into the sense latches, and the isolation and selection MOSFETs activated to place the voltages onto the M' bit line and the corresponding column line, thus programming the M' cells.

In the above programming operation, those cells which are not addressed for programming have their transfer gates off and the nonvolatile capacitors are well Isolated from programming pulses on the bit lines. Programming perturbation or disturb of the nonvolatile state of nonselected cells is negligible in this operation. Isolation of the cell from programming pulses on the column lines is obtained because the nonselected cells have their N-tank electrically floating because the transfer gates of these cells have been turned off. Since a pulse on the column line is used to program a cell into a positive threshold state, the perturbation or nonvolatile disturb which would be deleterious is the programming disturb on a cell which had been previously programmed into a negative threshold state as in FIG. 4B. When the large voltage programming pulse is applied to the column line of the cell in FIG. 4B when the transfer gate is turned off, the voltage drop across $\overline{CINS}$ will be a small fraction of the total voltage because $\overline{CINS}$ is much larger than $\overline{CDS}$. The floating tank node between $\overline{CINS}$ and $\overline{CDS}$ will go to a large positive voltage during the column line programming pulse and this will reverse bias the junction between the P-epitaxy and N-tank. The tank doping and depth should be large enough such that the depletion layer of this Junction does not penetrate to the surface during this programming operation.

If it is desirable to keep the sense-refresh amplifier designed for 5 V operation only, the programming operation can be carried out using separate other "M" circuitry as shown at the bottom of FIG. 6.

The previous paragraph has shown that the nonaddressed programming disturb in the array of FIG. 8 is negligible. Other possibilities for a disturb of the nonvolatile state occurs during the read operation because the voltages applied to read the cell are applied to the bit lines and the nonaddressed cells are isolated from the bit lines by transfer gates in the off state. There will be no disturb of the nonvolatile state of the nonselected cells. The actual read operation may perturb the state of the cell selected for reading if the read voltage and duration are a large fraction of the programming voltage and duration. A proper selection of the read voltages on the bit and column lines can minimize this effect. Also, the voltage of the sense-refresh amplifier can be used to reinforce the programmed state of the cell just read. This nonvolatile refresh operation can be carried out using any of several methods. One straightforward nonvolatile refresh operation would be to use "grounded storage gate read" with the column line at zero volts and first setting the selected cell tank voltage to about 5 V and floating followed by lowering the bit line voltage and floating. In the consequent read operation, the bit line and sense latch will set high if the cell was in a high capacitance state so that the sense latch voltage is In the proper direction to refresh the high capacitance nonvolatile state. If the cell was in the low capacitance state, the dummy cell will set the other side of the sense-refresh amplifier high and this voltage may be directed to the column line connected to the addressed memory cell using the isolation and selection MOSFETs of FIG. 9.

The array just described can operate in a true nonvolatile RAM mode with short duration programming pulses after each read operation. The array could also operate in a read-mostly mode in which the cells are occasionally programmed with relatively long duration pulses and then usually read with short lower voltage pulses many times before the cell is reprogrammed.

The array just described can also operate in an assigned function mode In which cells along some bit lines can be operated as volatile DRAM cells and cells along other bit lines could be operated as nonvolatile memory in a read-mostly mode. If differential amplifiers are used in the place of the sense latches shown in FIGS. 6 and 9, then the three states of the cell could be sensed: (1) volatile-1 in the high capacitance state, (2) volatile-0 in the high or low capacitance state, and (3) volatile-1 in the low capacitance state. Using the differential amplifier, any cell along any bit line can be operated and detected as a DRAM or nonvolatile memory cell.

In another embodiment of the assigned function mode which is simpler to operate, the complete array is operated in a DRAM read mode. Those cells which are to contain volatile DRAM data are all programmed into a high capacitance state as previously described and are written with volatile data into a 5 V or 0 V volatile state (voltages are examples). In this area of the array, the 5 V and 0 V volatile states are read and refreshed in the normal sense. In those portions of the array to be used as a nonvolatile array, some cells are programmed into high capacitance and other cells are programmed into low capacitance. All cells in this portion of the array are then written, read, and refreshed as 5 V volatile state cells. However, because of their different programmed capacitance states, the sense latches will set high or low, depending on the programmed capacitance state, in spite of the 5 V volatile condition programmed. Thus, although all portions of the array are operated as DRAM, the nonvolatile portion is operating as a programmable ROM. This array can be called an EEPRAM (an electrically eraseable and programmable RAM) in contrast to the EEPROM (an electrically eraseable and programmable ROM). The divsion between DRAM and nonvolatile memory can be made electrically, thus permitting change in the Function during operation.

Figure 10:
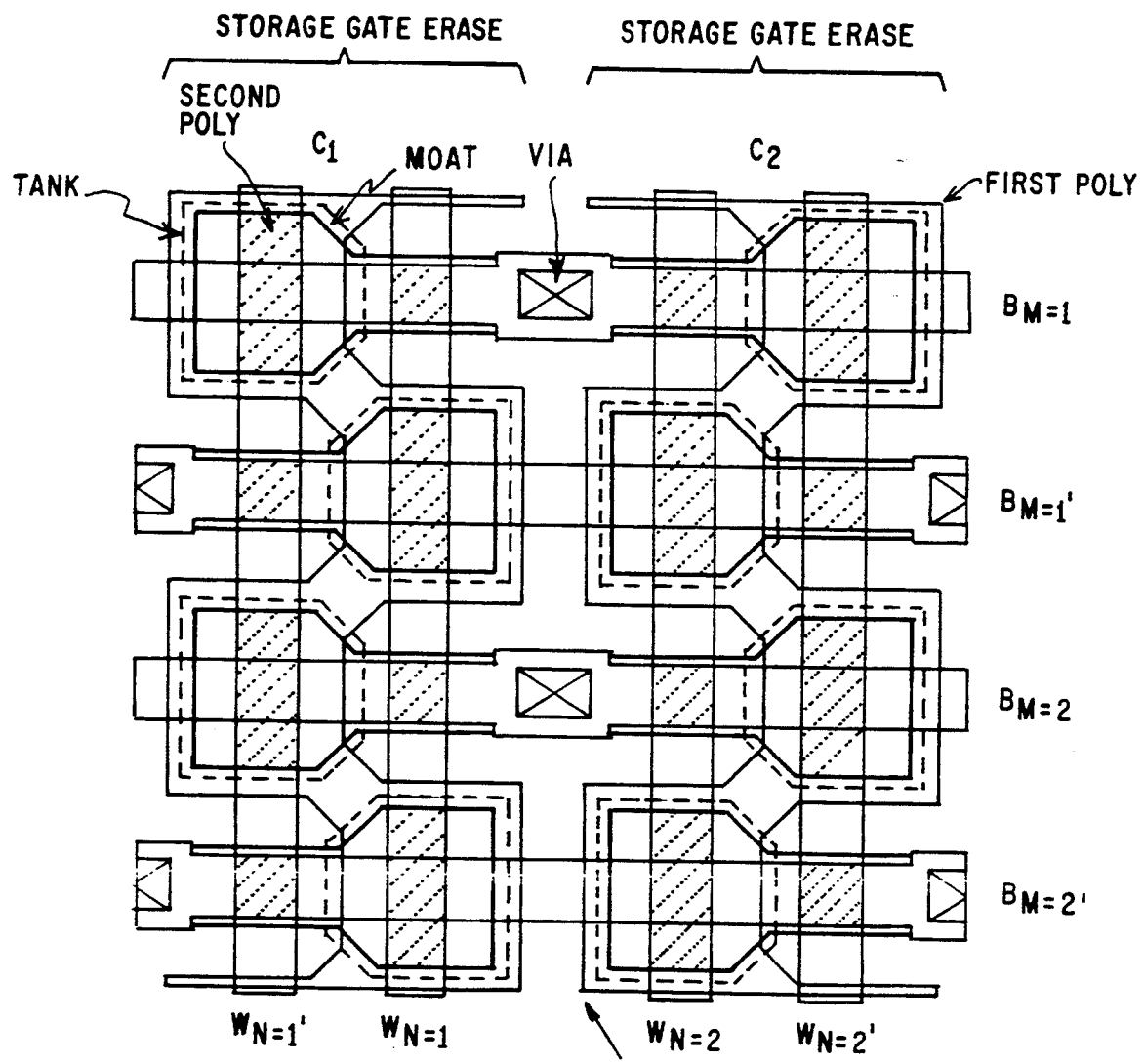
FIG. 10 is a top view of a folded bit line architecture with storage gate lines parallel to the word lines.
Figure 11:
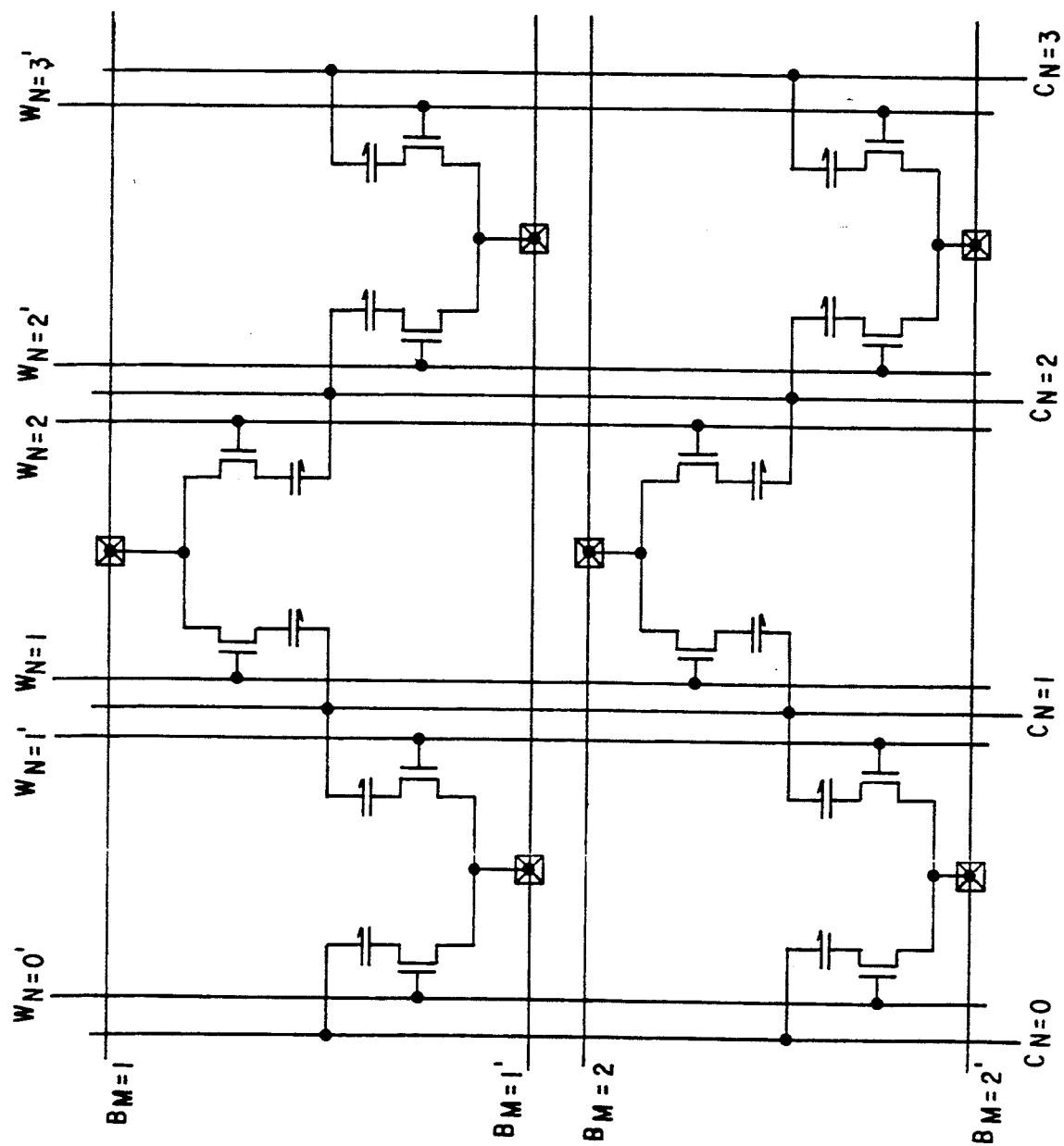
FIG. 11 is a circuit diagram showing an NVCRAM cell connections For the archetecture of FIG. 10.

FIG. 10 shows the layout of a portion of an array using parallel column and word lines. The identification of the electrode materials and structures in the silicon is the same as in FIG. 7. The cross section of this cell is equally well represented by FIG. 5. The storage gate control lines C(N) of FIG. 10 should be termed "storage gate control lines" rather that column lines since these lines are now parallel to the row word lines. FIG. 11 shows the electrical connections of a subarray corresponding to FIG. 10. The notation and symbolism of FIGS. 10 and 7 and of FIGS. 11 and 8 are identical.

It should be noted that the column lines Cn do not have to run the entire length of a row. If a row contains 80 cells and it is desired to program in groups of bytes of B cells, then each column line can be divided or segmented into ten separate sections, each containing eight cells and each addressed by an additional column address transistor which is added between the subarrays created by dividing the column lines.

One difficulty with the array of FIGS. 10 and 11 is that the programming voltages From the sense-refresh amplifiers or from the M programming circuitry cannot be applied simply to the storage gate control lines. In other words, programming voltages have to be applied to both the "N" and "M" directions on the array. This can be accomplished without transmitting data information along both directions by performing the programming operation in two steps. First, all cells in a row defined by a storage gate line and a word line are programmed into a positive threshold state by placing about 12 volts on the selected C(N) line and turning on the selected word line. Next, the appropriate cells along the row are programmed into a negative threshold state by supplying the appropriate high voltage along selected bit lines. This and other similar programming schemes are, in effect, program-by-byte, program-by-word, or program-by-row schemes rather than a program-by-bit scheme described earlier using FIGS. 7 and 8. The operation described for FIGS. 10 and 11 is simpler in that voltages do not have to be redirected onto the column lines C(M) by isolation and selection MOSFETs. The disadvantage of the programming operation described in this paragraph is that it is a two step operation which will therefore take longer to perform and will result in more program cycling of each cell in each row.

The operation of the array of FIGS. 10 and 11 does have an advantage with respect to programming disturb of nonselected cells during the program positive threshold state operation (a small perturbation In any case). In the configuration of FIGS. 10 and 11, the positive programming pulse along a C(N) line only is on the gates of those cells to be programmed on, for example, line W(N=1') and perturbs those cells on the adjoining row W(N=1). If rows W(N=1) and W(N=1') are both programmed in a two step operation, there can be no perturbation of the other n=/1 cells in the array. In the case of FIGS. 7 and 8, a programming pulse on a column line C(M) will perturb cells all along the column.

The array of FIGS. 10 and 11 can also be operated in all the modes discussed for the array of FIGS. 7 and 8.

The array of FIG. 10 can also be operated in a virtually nonvolatile mode in which the data is normally in DRAM volatile storage and is converted to nonvolatile only on power down or power loss. The nonvolatile data is then converted back to DRAM volatile data on power up. In normal operation with power on, all cells are in a negative threshold programmed state of high capacitance. The virtually nonvolatile operation can be understood using FIG. 12. Upon power down or power loss, the array of FIG. 12 goes into a refresh-like mode. The first step prior to power down is to read the DRAM data on one row (for example W(N=1) by setting these voltages onto the sense-refresh amplifiers shown on the right hand side of FIG. 12. With these sense-refresh voltages held on the bit lines by leaving the isolation MOSFETs $\phi_A$ in a state of high conductance, a program-positive threshold pulse (about 12 V) is applied to a storage gate line (For example C(N=1)). Only those cells whose tanks are connected to a low voltage bit line will change their program state to a positive threshold state of low capacitance. Those cells whose tanks are connected to the higher voltage bit line (about 5 V) will experience only 7 V across their nonvolatile stacks and the threshold voltage of these cells will change only slightly.

Upon power up, the nonvolatile state of a row of cells operated by W(N) is read by any one of the three read modes and the data set into the row of sense-refresh amplifiers. Next, the sense-refresh amplifiers are isolated by turning off the isolation MOSFETs operated by $\phi_A$ in FIG. 12 and a large positive pulse is applied to all bit lines by turning on the isolation MOSFETs (operated by $\phi_C$) which supply about V(M)=12 V to program all cells In the row operated by W(N) into the negative threshold state with high capacitance. Next, V(M) is lowered to about 0 V and $\phi_C$ is turned off. Next, the cells are written with volatile DRAM data by turning on $\phi_A$ to supply the data kept in the sense-refresh amplifiers and then W(N) is turned off by turning of $\phi_B$ leaving the volatile data in the cells on row N. This procedure is repeated row after row until all the data is converted to volatile DRAM data. It is important that the transfer gates be properly designed to minimize short channel subthreshold current which might perturb the volatile state of cells already written when a 12 V pulse Is applied to the bit lines to program other rows of cells.

It is Important that the power-off and power-on cycles accurately restore the volatile data into the DRAM array. That is to say 5 V volatile states must be restored to 5 V states and 0 V volatile states must be restored to 0 V states after the power-down and power-up cycles as an example. This can be performed by reading the volatile states using a bit line preset to a low voltage so that a 5 V cell will set its bit line to a 5 V level and a 0 V cell will set its bit line to a 0 V level when the 12 V pulse is applied to the appropriate C(N) line. Those cells originally having a 5 V volt volatile state will be left in a high capacitance nonvolatile state and those cells originally having a 0 V volatile state will have their nonvolatile state changed to a low capacitance nonvolatile state. On power up, all cells on a row will be charged to 5 V and then floated. Next, the bit line will be preset to a low voltage and the word line opened a second time. This will result in those sense-refresh amplifier bit lines attached to high capacitance cells going to say 5 V and those sense-refresh amplifier bit lines attached to low capacitance cells going to 0 V. Next, the sense-refresh amplifiers are Isolated and all cells on the row are reprogrammed into a state of high capacitance. Lastly, the voltages on the sense-refresh amplifiers are Fed back onto the cells with those cells which had been in a high capacitance state (originally 5 V volatile states before power off) will be written into a volatile state of 5 V. Thus, the operation has accurately restored the volatile data into its original state.

Figure 12:
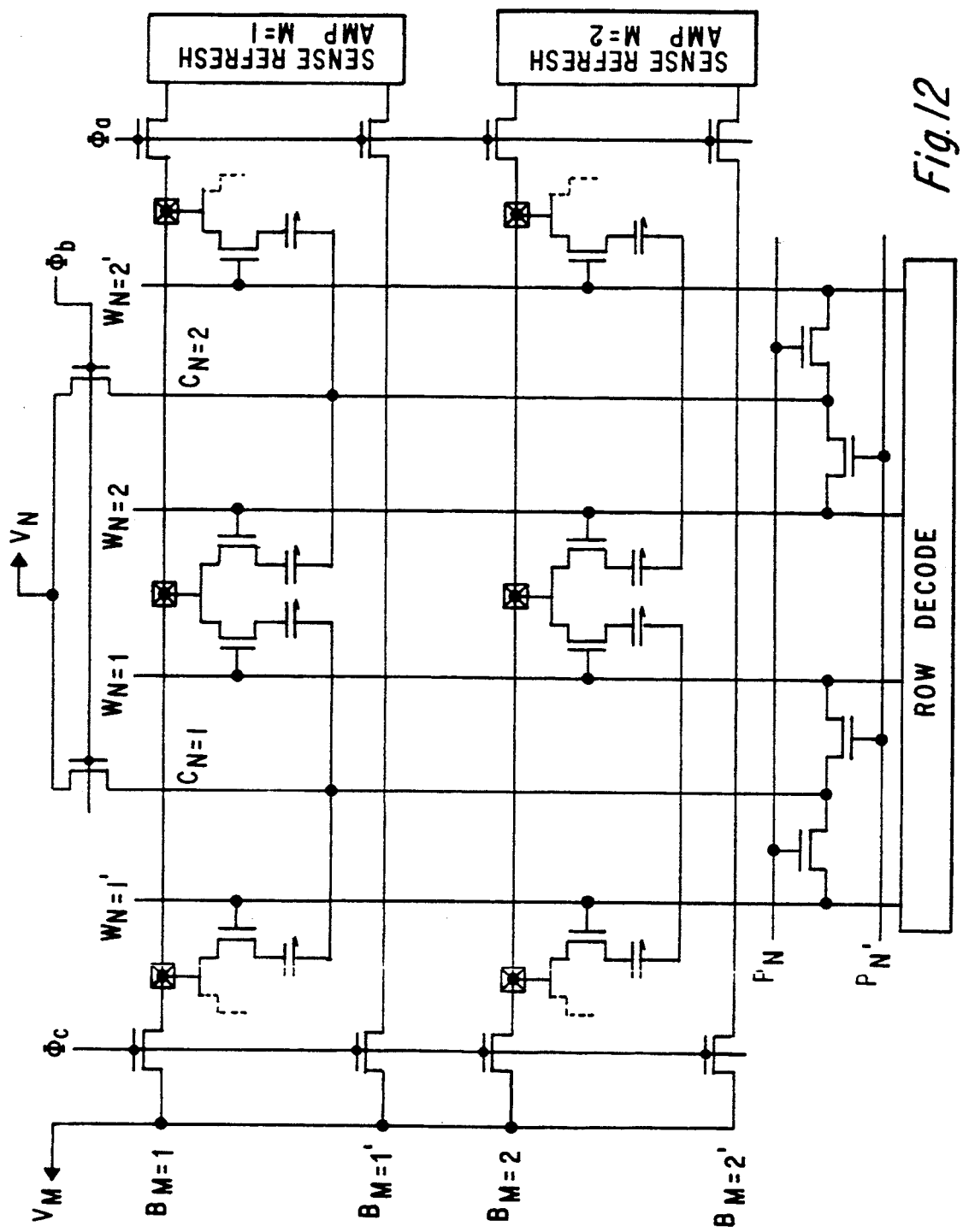
FIG. 12 is a circuit diagram showing peripheral circuits for virtually-nonvolatile RAM operation.

In order that a second high voltage row decoder does not have to be added to the array, the voltage selection MOSFETs operated by P(N) and P(N') are added at the bottom of FIG. 12. The row decoder can operate at 15 volts. During the power down operation, the 15 V is routed from a W(N) line to an appropriate C(N) line and Is, in a later step, routed from a W(N') line to the C(N) line for the read operations. The C(N) lines are connected to a low voltage V(N) (about 0 V) by means of the isolation MOSFETs operated by $\phi_B$. On power up, the C(N) lines are kept at 0 V but the row lines W(N) or W(N') must be taken to 15 V so that the high voltage V(M) can be applied to the tanks to program the cells into high capacitance.

The reason for chosing the array of FIGS. 10 and 12 for the virtually nonvolatile memory is that the large pulses on the C(N) lines do not perturb the volatile data on the whole array. These pulses perturb data only on adjoining rows which will be read in the next step.

The assigned function operation of the memory array can be expanded when the virtually nonvolatile embodiment is used. Now, not only can portions of the array be electrically assigned to volatile operation and other portions assigned to nonvolatile operation, but now data in volatile storage can be transferred to nonvolatile and data in nonvolatile can be transferred to volatile.

It can be seen from the above description that there has been provided a non-volatile capacitor random access memory (NVCRAM) which overcomes the problems of the prior art as enumerated above and whose fabrication is compatible with the fabrication of peripheral MOSFETs.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

I claim:
1. A memory cell having:
 (a) one or two transistors; and
 (b) a capacitor programmable into a high or a low capacitance, said capacitor comprising;
  (i) a nonvolatile gate,
  (ii) a nonvolatile stack thereunder for storing charge,
  (iii) a heavily doped n+ type region adjacent on at least one side to said nonvolatile gate wherein said n+ region extends beneath said stack,
  (iv) an n-type tank disposed beneath said nonvolatile stack to a depth and electrically connected to said n+ type region, and
  (v) a p-type substrate underlying the n+ region and the n-type tank.
2. A memory array comprising cells, each memory cell comprising:
 (a) one or two transistors; and

(b) a programmable capacitor, said capacitor comprising;
  (i) a nonvolatile gate,
  (ii) a nonvolatile stack thereunder for storing charge,
  (iii) a heavily doped n+ type region adjacent on at least one side to said nonvolatile gate wherein said n+ region extends beneath said stack,
  (iv) an n-type tank disposed beneath said nonvolatile stack to a depth and electrically connected to said n+ type region, and
  (v) a p-type substrate underlying the n+ region and the n-type tank.

3. The memory array according to claim 2 in which at least one memory cell is electrically programmed into a state of high capacitance and operated as volatile storage dynamic RAM cells and in which at least one memory cell is programmed either into a state of high capacitance or low capacitance and read as nonvolatile data depending on the capacitance state.

4. The memory array according to claim 3 in which volatile data is written into the memory cells in the high capacitance state and is transferred to nonvolatile by first using the volatile data from one row of memory cells activated by one word line to set sense amplifiers to a high or low voltage state depending on the volatile data and is then converted to nonvolatile by means of a large positive voltage pulse on the storage gate line parallel to the activated word line with the conversion of the cell to the nonvolatile low capacitance state depending on the difference in the voltage stored on the sense amplifier connected to the n-tank of the cell through the transfer gate and the voltage on the storage gate line.

5. A memory array according to claim 3 in which the nonvolatile data can be converted to volatile data by means of the read operations which set the sense amplifier to a high or low voltage depending on the nonvolatile state of the cells in one row of cells followed by an isolation of these sense amplifiers from the bit lines followed by the application of a large positive voltage to all bit lines with consequent programming of all memory cells on the row addressed followed by writing the volatile data back onto the cells using the voltages previously stored on the sense amplifiers.

6. The memory cell of claim 1 wherein a depletion region formed in the n-type tank at a boundary between the n-type tank and the p-type substrate by a positive programming voltage applied to the n+ region is smaller than the depth of the n-type tank.

7. The memory cell of claim 1 wherein a breakdown voltage of a junction formed by the n+ region and the n-tank is significantly larger than the voltage required for reading the cell.

* * * * *